(12) United States Patent
Horikawa et al.

(10) Patent No.: US 7,358,591 B2
(45) Date of Patent: Apr. 15, 2008

(54) CAPACITOR DEVICE AND SEMICONDUCTOR DEVICE HAVING THE SAME, AND CAPACITOR DEVICE MANUFACTURING METHOD

(75) Inventors: Yasuyoshi Horikawa, Nagano (JP); Akihito Takano, Nagano (JP); Kiyoshi Oi, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 100 days.

(21) Appl. No.: 11/046,879

(22) Filed: Feb. 1, 2005

(65) Prior Publication Data

US 2005/0199929 A1 Sep. 15, 2005

(30) Foreign Application Priority Data

Feb. 2, 2004 (JP) ............... 2004-026027

(51) Int. Cl.
 *H01L 29/00* (2006.01)
(52) U.S. Cl. ............ 257/532; 257/516; 257/535; 257/E27.016; 257/E21.649
(58) Field of Classification Search ........... 257/296, 257/516, 532, 535, 700, 758, E27.016, E21.649
 See application file for complete search history.

(56) References Cited

U.S. PATENT DOCUMENTS

| | | | |
|---|---|---|---|
| 6,038,133 A * | 3/2000 | Nakatani et al. ........... 361/760 |
| 6,734,542 B2 | 5/2004 | Nakatani et al. |
| 6,897,544 B2 * | 5/2005 | Ooi et al. .................. 257/532 |
| 6,921,977 B2 * | 7/2005 | Shimizu et al. ............ 257/758 |
| 6,975,516 B2 * | 12/2005 | Asahi et al. ............... 361/761 |
| 2003/0049885 A1 * | 3/2003 | Iijima et al. ............... 438/106 |
| 2006/0154496 A1 * | 7/2006 | Imamura et al. ........... 439/66 |

FOREIGN PATENT DOCUMENTS

| | | |
|---|---|---|
| JP | 2000-243873 | 9/2000 |
| JP | 2002-261449 | 9/2002 |

\* cited by examiner

*Primary Examiner*—Phat X. Cao
*Assistant Examiner*—Abul Kalam
(74) *Attorney, Agent, or Firm*—Edwards Angell Palmer & Dodge LLP

(57) ABSTRACT

In a capacitor device of the present invention, a capacitor parts that has a pair of terminals on both end sides respectively is embedded in an insulating film in a state that a lower surface of the capacitor parts is not covered with the insulating film, then upper wiring patterns that are connected to upper surfaces of a pair of terminals via holes formed in the insulating film on a pair of terminals are formed on an upper surface side of the insulating film respectively, and then lower wiring patterns that are connected to lower surfaces of a pair of terminals are formed on a lower surface side of the insulating film respectively.

9 Claims, 7 Drawing Sheets

CAPACITOR DEVICE AND SEMICONDUCTOR DEVICE HAVING THE SAME, AND CAPACITOR DEVICE MANUFACTURING METHOD

CROSS-REFERENCE TO RELATED APPLICATIONS

This application is based on and claims priority of Japanese Patent Application No. 2004-026027 filed on Feb. 2, 2004, the entire contents of which are incorporated herein by reference.

BACKGROUND OF THE INVENTION

1. Field of the Invention

The present invention relates to a capacitor device and a semiconductor device having the same and a capacitor device manufacturing method and, more particularly, a capacitor device capable of being applied as a decoupling capacitor that is arranged on the circuit board, on which the high speed LSI is mounted, to not only stabilize a power supply voltage but also reduce a high frequency noise, and a semiconductor device having the same and a capacitor device manufacturing method.

2. Description of the Related Art

In recent years, in the digital LSIs including the microprocessor, a reduction in the power supply voltage is carried forward on account of an increase in the processing speed and a reduction in the power consumption. In such digital LSIs, the power supply voltage of the LSI is liable to become unstable when the impedance of the LSI is abruptly varied, and so forth. Also, in the high speed digital LSI, a stable operation in a higher frequency (GHz) range is required and thus it is necessary to prevent a malfunction of the LSI due to the high frequency noise.

Therefore, for the purpose of stabilizing the power supply voltage and reducing the high frequency noise, a decoupling capacitor is arranged between a power supply line and a ground line of the LSI.

In the circuit boards having the conventional decoupling capacitor, there is such a circuit board (front side package type) that the LSI chip and the capacitor parts are packaged on one surface (front side) of the circuit board and connection terminals are provided on other surface (rear side) of the circuit board. In the front side package type, since leads must be provided between the LSI chip and the capacitor parts, a relatively large inductance is present between the leads. As a result, an effect of the decoupling capacitor is lessened.

Therefore, as shown in FIG. 1, in order to reduce a wiring length between the LSI chip and the decoupling capacitor, there is such a circuit board (back side package type) that an LSI chip 104 is packaged on one surface (front side) of a circuit board 100, on both surfaces of which mutually-connected wiring patterns 102 are provided, and capacitor parts 106 are packaged on the other surface (back side).

Also, in order to make the multi-layered wiring structure simple, there is such a circuit board that the capacitor parts are embedded in the insulating layer of the circuit board (for example, Patent Literature 1 (Patent Application Publication (KOKAI) 2002-261449)).

In addition, in Patent Literature 2 (Patent Application Publication (KOKAI) 2000-243873), there is set forth such a circuit board that the laminated ceramic capacitor is packaged in the recess portion provided in the core board in a state that the capacitor is buried in the filling resin and the resin insulating layer and the wiring layers are provided thereon and thereunder.

However, in the back side package type shown in FIG. 1, a wiring length between the LSI chip and the decoupling capacitor can be shortened rather than the front side package type, nevertheless areas on the back side, in which a connection terminal 108 is arranged respectively, are restricted because the capacitor parts 106 are packaged on the back side of the circuit board 100. In addition, as indicated by a broken line in FIG. 1, since the wirings must be provided horizontally from the capacitor parts 106 to the connection terminals 108 on the back side of the circuit board 100, there is a limit to a reduction in the parasitic inductance and thus it is assumed that an effect of the decoupling capacitor is lessened. Further, the problem that the back side package type cannot easily respond to an increase of the wiring density still remains.

Also, in Patent Literature 1, the technology to minimize the parasitic inductance by reducing the wiring length between the LSI chip and the decoupling capacitor is not satisfactorily considered. In addition, in Patent Literature 2, an effect of reducing the inductance of the wirings connected to the laminated ceramic capacitor on and under which the connection pads are provided can be attained, nevertheless the core board must be processed in a complicated manner. Therefore, the manufacturing steps become complicated and also there is a limit to a reduction in the parasitic inductance because the wirings must be formed to pass through the core board.

SUMMARY OF THE INVENTION

It is an object of the present invention to provide a capacitor device capable of reducing a parasitic inductance by reducing its wiring length to the shortest minimum and enhancing an effect as a decoupling capacitor, and a semiconductor device having the same and a capacitor device manufacturing method.

The present invention is concerned with a capacitor device that comprises an insulating film; a capacitor parts which has terminals on both end sides respectively, the terminals on both end sides being arranged in a horizontal direction, and which is embedded in the insulating film in a state that a lower surface of the capacitor parts is not covered with the insulating film; via holes formed in areas of the insulating film on the terminals on both end sides respectively; upper wiring patterns formed on an upper surface side of the insulating film and connected to upper surfaces of the terminals on both end sides via the via holes respectively; and lower wiring patterns formed on a lower surface side of the insulating film and connected to lower surfaces of the terminals on both end sides respectively.

In the present invention, the capacitor parts that has terminals on both end sides respectively is embedded in the insulating film in a state that the terminals on both end sides are arranged in the horizontal direction and also the lower surface of the capacitor parts is not covered with the insulating film. That is, preferably the capacitor parts is buried in the insulating film in a state that the lower surface of the capacitor parts and the lower surface of the insulating film constitute the coplanar surface.

Also, the via holes are formed in portions of the insulating film on the terminals on both end sides of the capacitor parts, and the upper wiring patterns connected to upper surfaces of the terminals on both end sides via the via holes respectively are formed on the upper surface side of the insulating film.

In addition, the lower wiring patterns are connected directly to the lower surfaces of the terminals on both end sides of the capacitor parts without the intervention of the via holes respectively.

In this manner, in the capacitor device of the present invention, the connection portions to which the connection terminals are connected are arranged on the wiring patterns over and under the terminals on both end sides of the capacitor parts respectively. Therefore, unlike the prior art, it is not necessary to provide the unnecessary wiring from the capacitor parts to the connection portions. As a result, since the series equivalent inductance can be reduced, effects of suppressing the variation in the power supply voltage and reducing the high frequency noise in the high speed LSI can be enhanced. In particular, since the terminals on both end sides of the capacitor parts and the lower wiring patterns are connected directly without the intervention of the via holes, the series equivalent inductance in those portions can be largely reduced.

Also, since the insulating film is utilized as the core member, a thickness reduction of the insulating film can be performed to meet to a thickness of the capacitor parts, and also the lower wiring patterns are connected directly to the terminals on both end sides without the intervention of the via holes. Therefore, the present invention can deal easily with the thickness reduction of the capacitor device.

The present invention is concerned with a capacitor device manufacturing method comprising the steps of forming a metallic foil on a supporting member via a release layer; mounting a capacitor parts, which has terminals on both end sides respectively, on the metallic foil such that the terminals on both end sides are arranged in a horizontal direction; forming an insulating film that covers the capacitor parts; forming via holes in portions of the insulating film on the terminals on both end sides of the capacitor parts respectively; forming upper wiring patterns, which are connected to upper surfaces of the terminals on both end sides via the via holes respectively, on an upper surface side of the insulating film; releasing the metallic foil from the release layer to get a capacitor member that is composed of the metallic foil, the capacitor parts, and the upper wiring patterns; and forming lower wiring patterns, which are connected to lower surfaces of the terminals on both end sides respectively, on a lower surface side of the insulating film by patterning the metallic foil of the capacitor member.

In the present invention, first the metallic foil (the copper foil, or the like) is formed releasably on the supporting member (the metal plate or the resin plate) with rigidity, and then the capacitor parts having the terminal on both end sides is mounted on the metallic foil to arrange the terminals in the horizontal direction. Then, the insulating film (the resin film, or the like) for covering the capacitor parts is formed, and then the upper wiring patterns that are connected to the upper surfaces of the terminals on both end sides of the capacitor parts via the via holes formed in the insulating film respectively are formed on the upper surface side of the insulating film. Then, the metallic foil on which the capacitor parts is mounted is peeled off from the release layer, and then the lower wiring patterns that are connected to the lower surfaces of the terminals on both end sides respectively are formed on the lower surface side of the insulating film by patterning the metallic foil on the lower surface of the insulating film.

Since such manufacturing method is employed, the capacitor device having the above configuration can be easily manufactured.

As described above, in the capacitor device of the present invention, since the wiring length can be reduced to the shortest one and thus the series equivalent inductance can be reduced. Therefore, an effect of the decoupling capacitor can be enhanced.

DETAILED DESCRIPTION OF THE PREFERRED EMBODIMENTS

Embodiments of the present invention will be explained with reference to the accompanying drawings hereinafter.

First Embodiment

FIGS. 2A to 2M are sectional views showing a capacitor device manufacturing method according to a first embodiment of the present invention.

Figure 1:
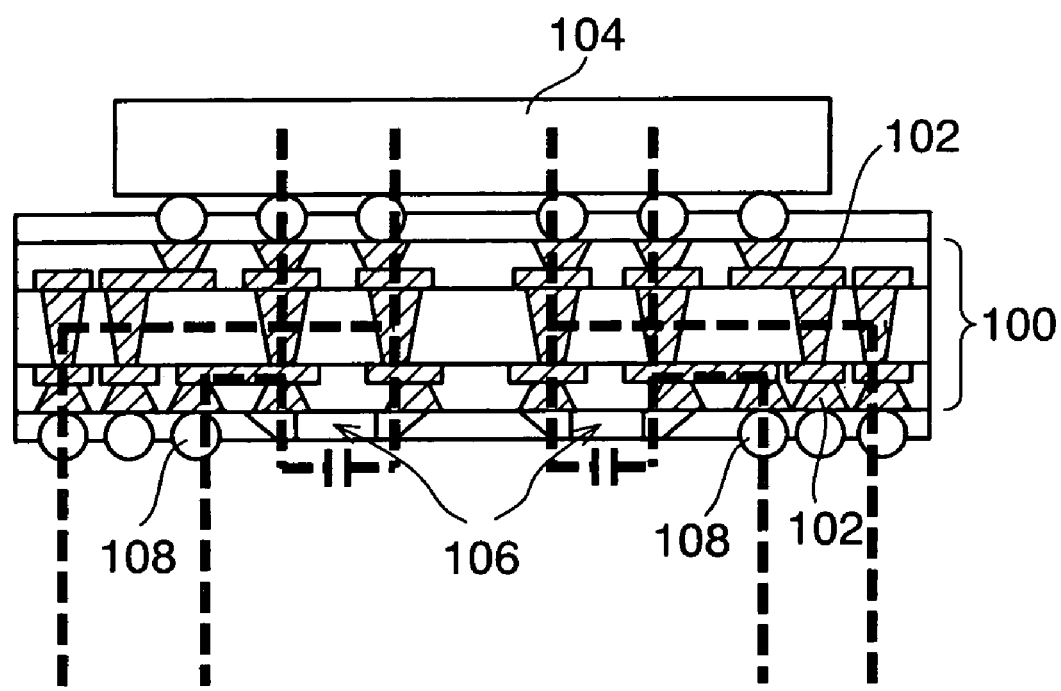
FIG. 1 is a sectional view showing a capacitor device in the prior art.
Figure 2A:
FIGS. 2A to 2M are sectional views showing a capacitor device manufacturing method according to a first embodiment of the present invention.

In the capacitor device manufacturing method according to the first embodiment of the present invention, as shown in FIG. 2A, first a supporting body 10 with rigidity is prepared. As the supporting body 10, a metal plate made of copper, or the like, a resin plate, and the like are used preferably.

Figure 2B:
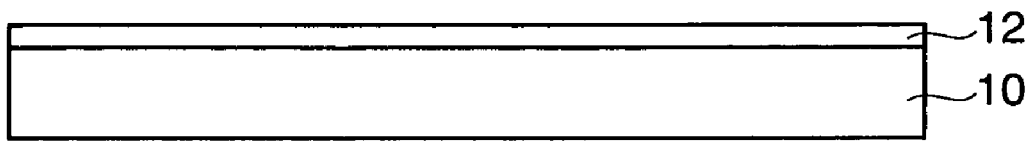
Figure 2C:
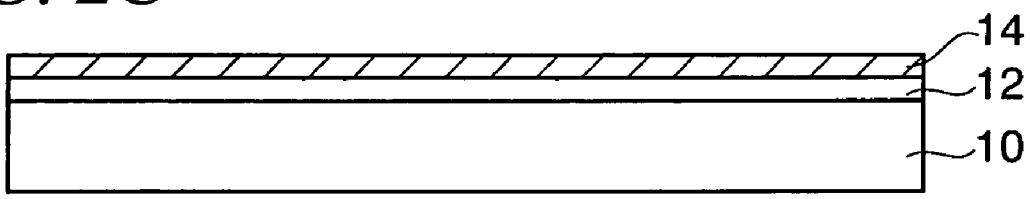

Then, as shown in FIG. 2B, a release layer 12 made of a resin having an adhering function is formed on one surface of the supporting body 10. Then, as shown in FIG. 2C, a copper foil 14 (metallic foil) of 5 to 40 μm thickness is pasted onto the release layer 12. A lower surface of the release layer 12 has a firm adhesion to the supporting body 10, while an upper surface of the release layer 12 is pasted onto the copper foil 14 in a weak adhesive strength state. Thus, the copper foil 14 can be easily released from the release layer 12 later.

Figure 2D:
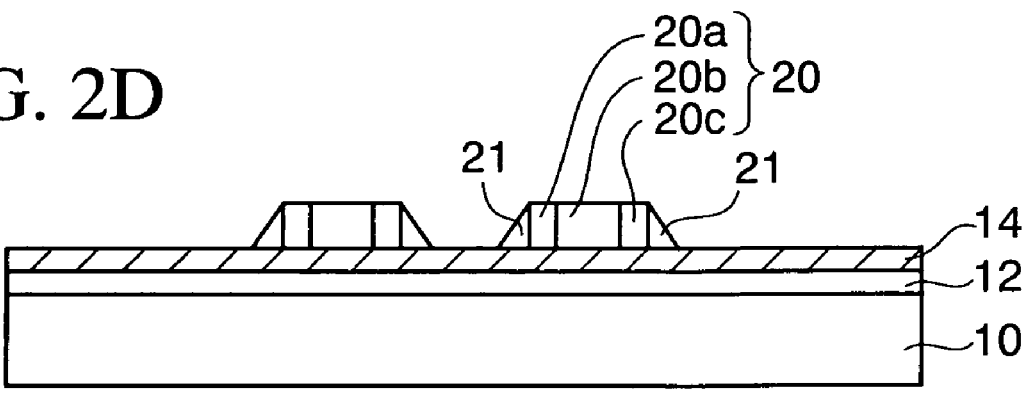

Then, as shown in FIG. 2D, a plurality of capacitor parts 20 each consisting of a first terminal 20a, a capacitor portion 20b, and a second terminal 20c are prepared. These capacitor parts 20 form a common chip capacitor in which the first terminal 20a and the second terminal 20c are provided on both sides of the capacitor portion 20b, respectively. The capacitor parts 20 are mounted in a state such that these terminals 20a, 20c are arranged horizontally.

Although not particularly described, the capacitor portion 20b has a structure, for example, in which a plurality of electrode layers and a plurality of dielectric layers are stacked and predetermined electrode layers are connected electrically to the first terminal 20a or the second terminal 20c. Alternately, the capacitor parts having the structure in which paired electrodes are provided in plural on both end sides may be used.

Then, solder paste (not shown) is coated selectively on portions of the copper foil 14 on which the first and second terminals 20a, 20c of the capacitor parts 20 are arranged. Then, the capacitor parts 20 are positioned on the copper foil 14 such that the first and second terminals 20a, 20c of the capacitor parts 20 are aligned with the solder paste.

Then, the solder paste is reflown and cured by the reflow annealing. Thus, the capacitor parts 20 are secured on the copper foil 14. At this time, a solder layer 21 is left in a state that such solder layer is connected electrically to outer side portions of the first and second terminals 20a, 20c of the capacitor parts 20. Also, the capacitor parts 20 are secured in a state that such parts are aligned with predetermined positions on the copper foil 14 respectively.

Figure 2E:
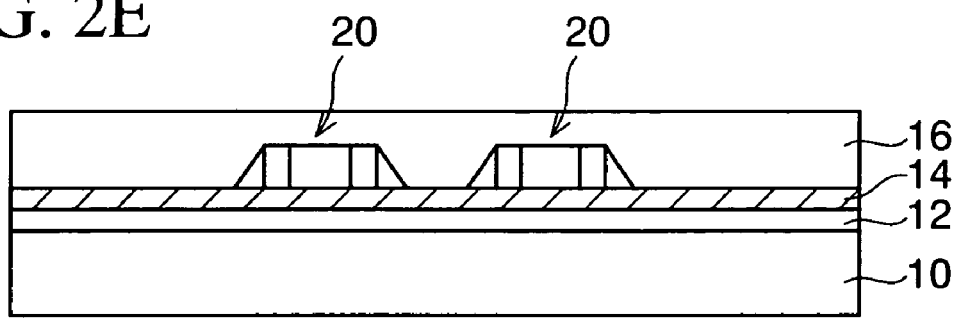

Then, as shown in FIG. 2E, an insulating film 16 for covering the capacitor parts 20 is formed by laminating a resin film made of an epoxy resin on the copper foil 14 and the capacitor parts 20, or the like. Thus, the capacitor parts 20 are buried in the insulating film 16 and also the insulating film 16 is formed in such a manner that its upper surface is made substantially flat.

Figure 2F:
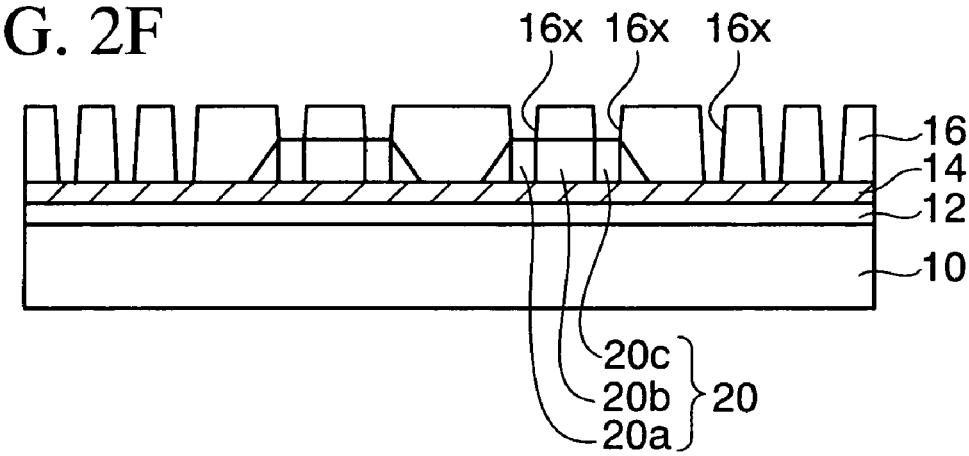

Then, as shown in FIG. 2F, the laser beam is irradiated onto portions of the insulating film 16 on the first and second terminals 20a, 20c of the capacitor parts 20 and the copper foil 14. Thus, via holes 16x each have a depth reaching first and second terminals 20a, 20c of the capacitor parts 20 and predetermined portions of the copper foil 14, respectively. Then, insides of the via holes 16x are cleaned by applying the desmear process to the via holes 16x.

Figure 2G:
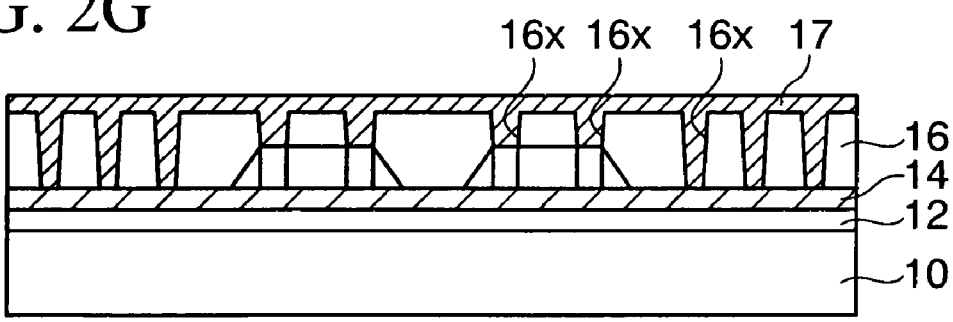

Then, as shown in FIG. 2G, a seed Cu film (not shown) is formed on the insulating film 16 and inner surfaces of the via holes 16x by the electroless plating or the sputter method. Then, a Cu film 17 is formed on the seed Cu film by electrolytic plating utilizing this seed Cu film as a plating power supply layer. The Cu film 17 is formed to fill the via holes 16x and have an almost flat upper surface.

Figure 2H:
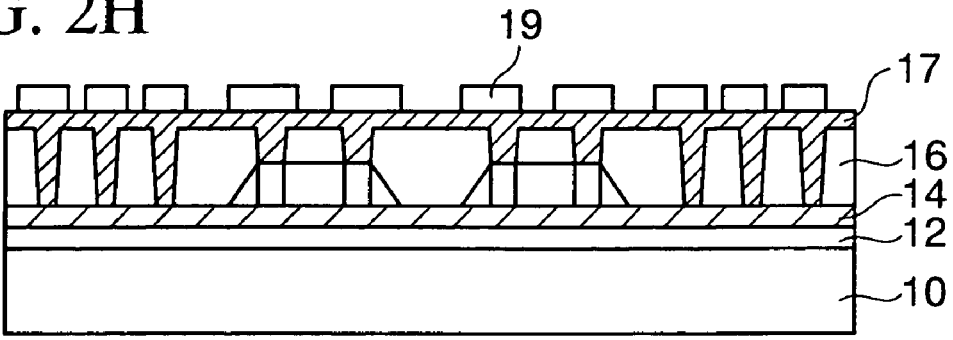

Then, as shown in FIG. 2H, a resist film 19 used to form upper wiring patterns is patterned on the Cu film 17 by the photolithography, and then the Cu film 17 is etched by using the resist film 19 as a mask. Then, the resist film 19 is removed.

Figure 2I:
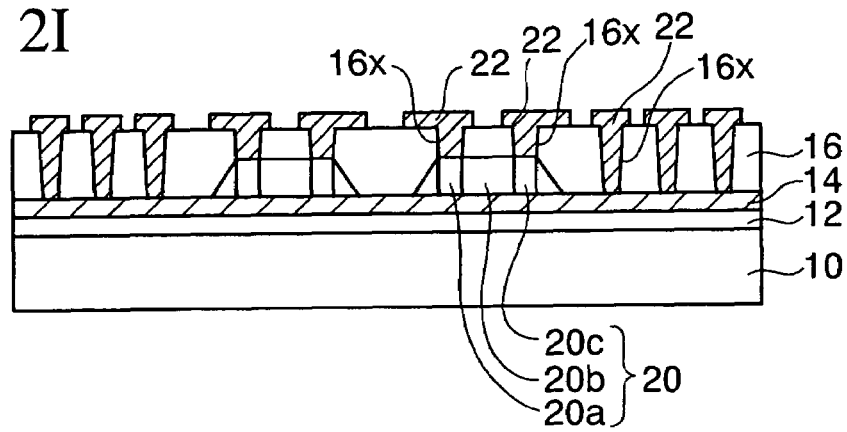

Accordingly, as shown in FIG. 2I, upper wiring patterns 22 connected to the first and second terminals 20a, 20c of the capacitor parts 20 and the copper foil 14 via the via holes 16x are formed on the upper surface side of the insulating film 16.

Figure 2J:
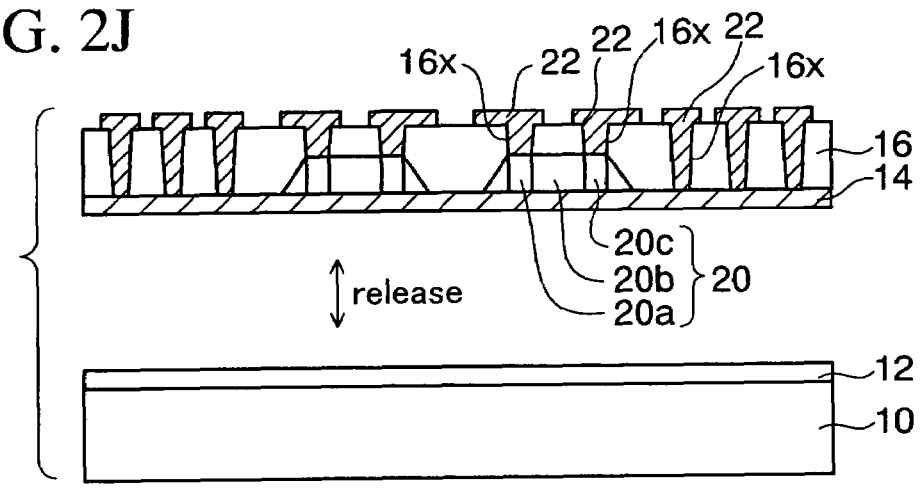
Figure 2K:
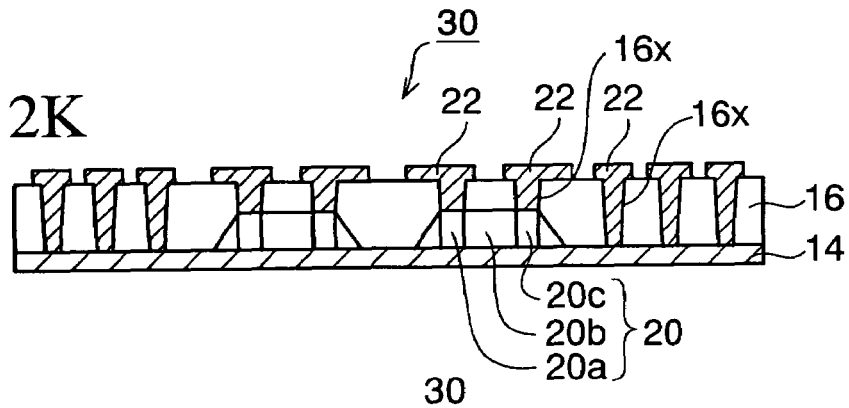

Then, as shown in FIG. 2J, the supporting body 10 and the release layer 12 are separated from this resultant structure by peeling off the copper foil 14 from the release layer 12. Thus, as shown in FIG. 2K, a capacitor member 30 that is composed of the copper foil 14, the capacitor parts 20 mounted thereon, the insulating film 16 for covering the capacitor parts 20, and the upper wiring patterns 22 connected to the first and second terminals 20a, 20c of the capacitor parts 20 and the copper foil 14 via the via holes 16x in the insulating film 16 is obtained.

Figure 2L:
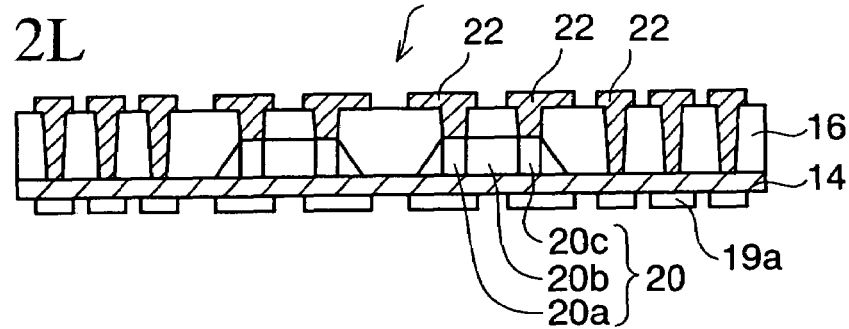

Then, as shown in FIG. 2L, resist films 19a used to form lower wiring patterns are patterned on a lower surface of the copper foil 14 of the capacitor member 30 by the photolithography, and then the copper foil 14 is etched by using the resist films 19a as a mask. Then, the resist films 19a are removed.

Figure 2M:
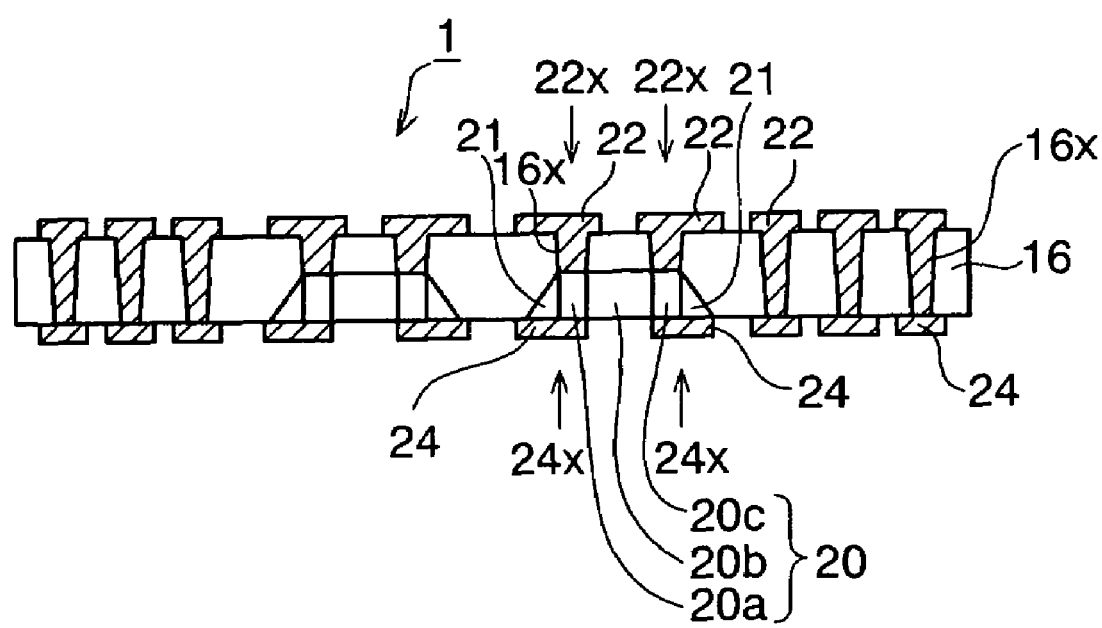

Thus, as shown in FIG. 2M, lower wiring patterns 24 are formed on the lower surface side of the insulating film 16.

The lower wiring patterns 24 are formed to be connected directly to lower surfaces of the first and second terminals 20a, 20c of the capacitor parts 20 and the solder layers 21 respectively. Also, remaining lower wiring patterns 24 are connected to the upper wiring patterns 22 via the via holes 16x.

With the above, a capacitor device 1 of the embodiment of the present invention is completed.

In the capacitor device 1 of the present embodiment, as shown in FIG. 2M, the capacitor parts 20 to both end sides of which the first terminal 20a and the second terminal 20c are provided are embedded in the insulating film 16 in a state that a pair of electrodes 20a, 20c are arranged in the horizontal direction. As the capacitor parts 20 embedded in the insulating film 16, preferably a ceramic chip capacitor is used. Then, the lower surfaces of the capacitor parts 20 are not covered with the insulating film 16, and the lower surfaces of the capacitor parts 20 and the lower surface of the insulating film 16 are formed to constitute a coplanar surface. In the present embodiment, the insulating film 16 functions as a core member of the capacitor device 1.

The first and second terminals 20a, 20c of the capacitor parts 20 are connected to the upper wiring patterns 22 via the via holes 16x formed in the overlying insulating film 16, and preferably first connection portions 22x are defined right over the first and second terminals 20a, 20c respectively.

Also, the lower wiring patterns 24 are connected directly to the lower surfaces of the first and second terminals 20a, 20c of the capacitor parts 20 without the intervention of the via hole, and preferably second connection portions 24x are defined right under the first and second terminals 20a, 20c. Since the lower wiring patterns 24 are also connected to the lower surfaces of the solder layers 21 connected to their side surfaces other than the lower surfaces of the first and second terminals 20a, 20c, such lower wiring patterns 24 can be connected to the first and second terminals 20a, 20c in a state that their contact resistance is reduced.

Also, the via holes 16x to pass through the insulating film 16 are provided in portions of the insulating film 16 in which the capacitor parts 20 are not mounted. The upper wiring patterns 22 and the lower wiring patterns 24 connected mutually via the via holes 16x are formed on both surface sides of the insulating film 16 respectively.

In the capacitor device 1 of the present embodiment, the first connection portions 22x arranged just over the first and second terminals 20a, 20c are connected electrically to the electronic parts, and the second connection portions 24x arranged just under the first and second terminals 20a, 20c are connected electrically to the wiring board (mother board).

Alternatively, conversely the first connection portions 22x may be connected electrically to the wiring board (mother board), and the second connection portions 24x may be connected electrically to electronic parts. Then, the capacitor parts 20 are arranged between the power supply line and the ground line to act as the decoupling capacitor.

In this manner, in the capacitor device 1 of the first embodiment, the first and second connection portions 22x, 24x are arranged just over and just under the first and second terminals 20a, 20c of the capacitor parts 20, respectively. Therefore, unlike the prior art, it is not needed to provide the unnecessary wiring from the capacitor parts to the connection portions. As a result, because the series equivalent inductance can be reduced, effects of suppressing the variation in the power supply voltage and reducing the high frequency noise in the high speed LSI can be enhanced. In particular, because the first and second terminals 20a, 20c and the lower wiring patterns 24 are connected directly without the intervention of the via holes, the series equivalent inductance in those portions can be largely reduced.

Also, because a wiring density of the capacitor device 1 can be improved readily, the present embodiment is convenient for size reduction of the capacitor device 1.

In addition, because the insulating film 16 is utilized as the core member, a thickness reduction of the insulating film 16 can be performed to meet to a thickness of the capacitor parts 20, and also the lower wiring patterns 24 are connected directly to the first and second terminals 20a, 20c without the intervention of the via holes. Therefore, the present embodiment can deal easily with the thickness reduction of the capacitor device 1.

Second Embodiment

Figure 3:
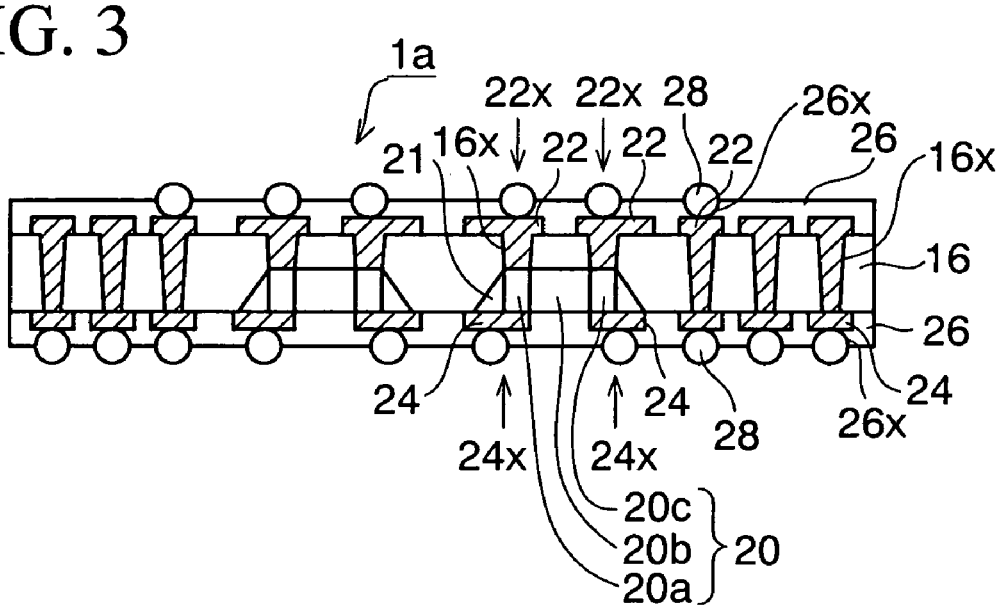
FIG. 3 is a sectional view showing a capacitor device according to a second embodiment of the present invention.

FIG. 3 is a sectional view showing a capacitor device according to a second embodiment of the present invention. The second embodiment gives a mode in which the connection terminals are provided in the capacitor device 1 in FIG. 2M in the first embodiment. As shown in FIG. 3, in a capacitor device 1a of the second embodiment, a solder resist film 26 in which opening portions 26x are formed on the first connection portions 22x, the second connection portions 24x, etc. is formed on both surface sides of the capacitor device 1 in FIG. 2M respectively. Also, connection terminals 28 are provided on the first connection portions 22x, the second connection portions 24x, etc. on both surface sides of the capacitor device 1a. The connection terminals 28 are formed of solder balls, for example.

Figure 4:
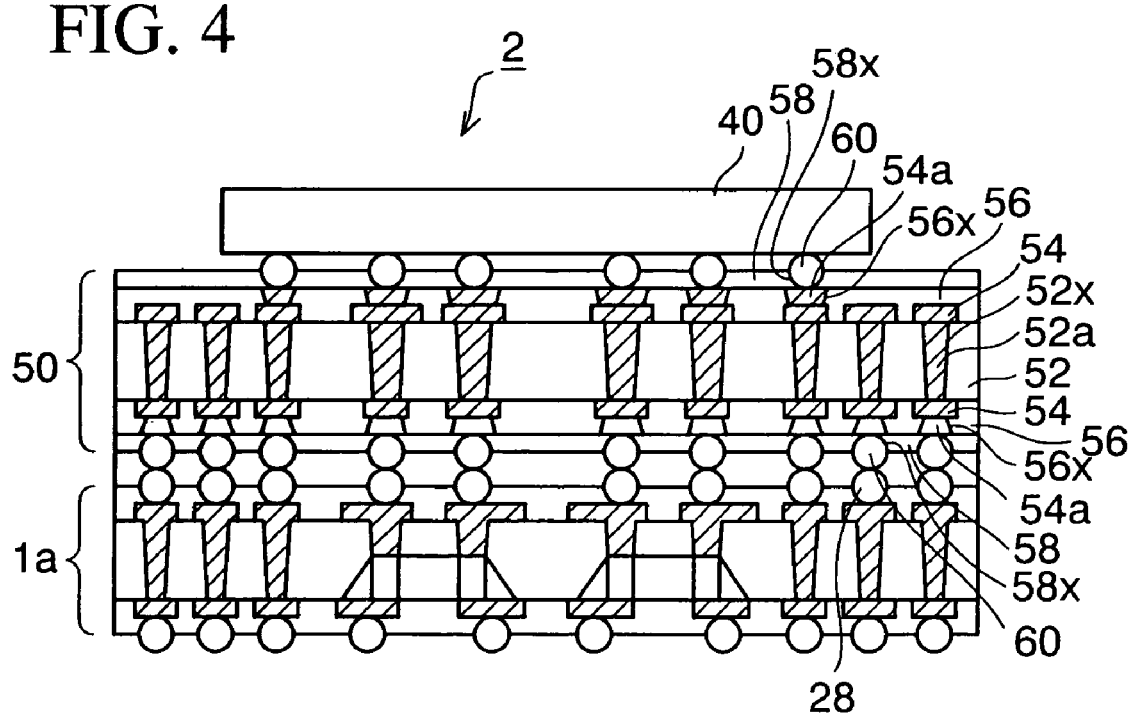
FIG. 4 is a sectional view showing a semiconductor device having the capacitor device according to the second embodiment of the present invention.

Next, a semiconductor device having the structure in which the circuit board on which the semiconductor chip is mounted is connected to the capacitor device 1a of the second embodiment will be explained hereunder. As shown in FIG. 4, first a circuit board 50 on which a semiconductor chip 40 is mounted is prepared. In this circuit board 50, first wiring patterns 54 are formed on both surface sides of a core substrate 52 respectively, and the first wiring patterns 54 on both surface sides are connected mutually via through electrodes 52a that are filled in through holes 52x provided in the core substrate 52. Then, an insulating film 56 in which opening portions 56x are provided on the first wiring patterns 54 is formed on both surface sides of the circuit board 50 respectively.

Then, second wiring patterns 54a connected to the first wiring patterns are formed in the opening portions 56x on both surface sides of the core substrate 52 respectively. Also, a solder resist film 58 in which opening portions 58x are provided on the second wiring patterns 54a respectively is formed on both surface sides of the core substrate 52. Also, connection terminals 60 connected to the second wiring patterns 54a are formed in the opening portions 58x in the solder resist film 58 respectively. In addition, the semiconductor chip 40 is connected to the upper connection terminals 60 of the circuit board 50 and is mounted.

Then, the lower connection terminals 60 of the circuit board 50 on which the above semiconductor chip 40 is mounted are connected to the upper connection terminals 28 of the capacitor device 1a in FIG. 3.

With the above, the circuit board 50 on which the semiconductor chip 40 is mounted is stacked and connected on the capacitor device 1a in FIG. 3 three-dimensionally, and thus the semiconductor device 2 in which the capacitor parts 20 are built is constructed. The capacitor parts 20 built in the semiconductor device 2 are arranged between the power supply line and the ground line of the semiconductor device 2 and act as the decoupling capacitor.

In this case, the circuit board 50 on which the semiconductor chip 40 is mounted may be connected to the lower surface side of the capacitor device 1a in FIG. 3.

In the semiconductor device 2 of the present embodiment, the semiconductor chip 40 is mounted on the capacitor device 1a whose inductance is reduced, and also the capacitor device 1a and the semiconductor chip 40 are mutually connected horizontally not to extend the lead. Therefore, the wiring length can be reduced shortest and also the parasitic inductance can be reduced largely. As a result, the effects of suppressing the variation in the power supply voltage and reducing the high frequency noise in the high speed LSI can be enhanced.

Third Embodiment

Figure 5:
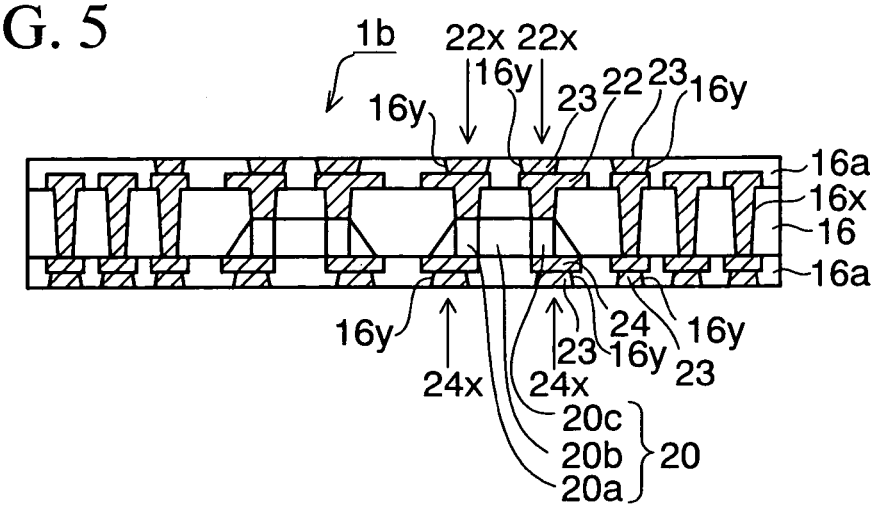
FIG. 5 is a sectional view showing a capacitor device (#1) according to a third embodiment of the present invention.
Figure 6:
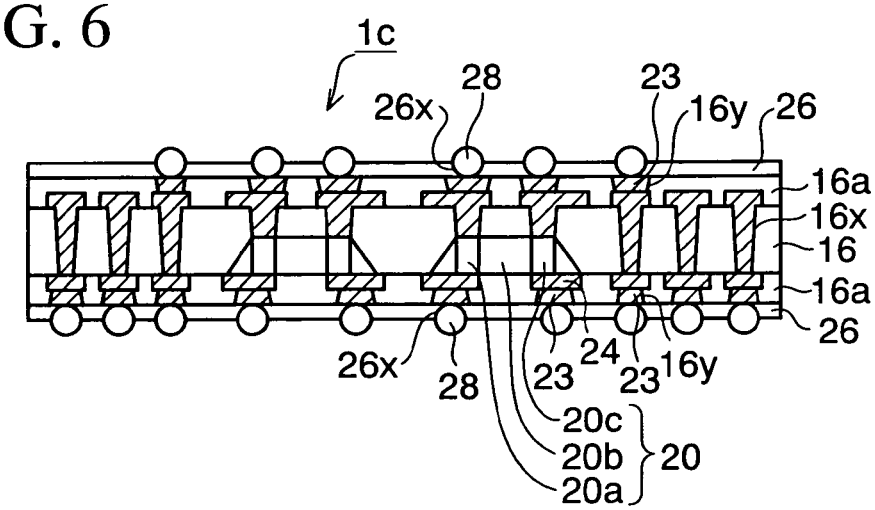
FIG. 6 is a sectional view showing a capacitor device (#2) according to the third embodiment of the present invention.
Figure 7:
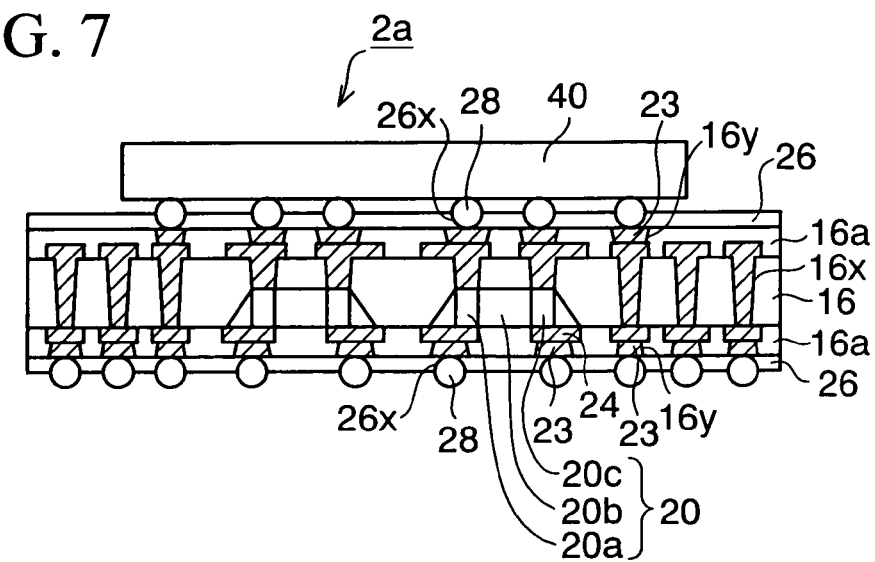
FIG. 7 is a sectional view showing a semiconductor device having the capacitor device according to the third embodiment of the present invention.

FIG. 5 is a sectional view showing a capacitor device (#1) according to a third embodiment of the present invention, FIG. 6 is a sectional view showing a capacitor device (#2) according to the third embodiment of the present invention, and FIG. 7 is a sectional view showing a semiconductor device having the capacitor device in which the semiconductor chip is mounted on the capacitor device in FIG. 6.

As shown in FIG. 5, in a capacitor device (#1) 1b of the third embodiment, an insulating film 16a in which opening portions 16y are provided on the first connection portions 22x and the second connection portions 24x is formed on both surface sides of the capacitor device 1 in FIG. 2M in the first embodiments, respectively. Also, second-layer wirings 23 connected to the first connection portions 22x and the second connection portions 24x, respectively, are formed in the opening portions 16y in the insulating film 16a, respectively.

In this manner, the wiring layer connected to the upper wiring patterns 22 and the lower wiring patterns 24 of the capacitor device 1 in FIG. 2M in the first embodiment via the opening portions in the insulating film are formed in one layer or more, respectively. A mode may be employed such that n-layers (n is an integer that is 2 or more) of the wiring is provided.

Also, as shown in FIG. 6, in a capacitor device (#2) 1c of the third embodiment, the solder resist film 26 in which the opening portions 26x are provided in predetermined portions on the second-layer wirings 23 is formed on both surface sides of the capacitor device (#1) 1b in FIG. 5. In addition, the connection terminals 28 made of the solder balls or the like and connected to the second-layer wirings 23 are provided in the opening portions 26x in the solder resist film 26 formed on both surface sides respectively.

In addition, in the third embodiment, as shown in FIG. 7, the semiconductor chip 40 is connected to the upper connection terminals 28 of the capacitor device 1c in FIG. 6, whereby a semiconductor device 2a having the capacitor parts 20 is completed. In this case, the connection terminals provided to the semiconductor chip 40 may be connected to the upper second-layer wirings 23 of the capacitor device 1c.

In the semiconductor device 2a of the third embodiment, since the semiconductor chip 40 is connected to the capacitor device 1c whose inductance is reduced, the same advantages as the second embodiment can be achieved.

Here, such a mode may be employed similarly that the semiconductor chip is connected directly to the upper connection terminals 28 of the capacitor device 1a (FIG. 3) in the second embodiment. And the semiconductor chip 40 may be connected to the lower connection terminals 28 of the capacitor device 1c in FIG. 6.

What is claimed is:

1. A capacitor device comprising:

an insulating film made of a single layer;

chip capacitor parts composed of a capacitor portion and terminals on only side surfaces of both end sides, respectively, of the capacitor portion, the terminals arranged within a boundary of the side surface of the capacitor portion without protruding above a top surface of the capacitor portion and are chip capacitors, the terminals on both end sides being arranged in a horizontal direction, and which are mounted to be embedded in the insulating film in a state such that a lower surface of the chip capacitor parts is not covered with the insulating film, and only one chip capacitor parts being arranged in a thickness direction of the insulating film;

via holes formed in areas of the insulating film directly on the terminals on both end sides, respectively;

upper wiring patterns formed on an upper surface side of the insulating film and connected to upper surfaces of the terminals on both end sides via the via holes, respectively; and lower wiring patterns formed directly on a lower surface of the insulating film and connected to lower surfaces of the terminals on both end sides, respectively, wherein an insulating film is not formed between the lower surfaces of the terminals of the chip capacitor parts and the lower wiring patterns, the lower wiring patterns being directly connected to the lower surfaces of the terminals without the intervention of via holes.

2. The capacitor device according to claim 1, wherein first connection portions are defined in portions of the upper wiring patterns on the terminals on both end sides respectively, second connection portions are defined in portions of the lower wiring patterns under the terminals on both end sides respectively, and connection terminals are provided to the first connection portions and the second connection portions respectively.

3. The capacitor device according to claim 1, wherein a solder layer is formed on outer side surface portions of the terminals on both end sides of the chip capacitor parts and connected thereto respectively, and the lower wiring patterns are further connected to lower surfaces of solder layers.

4. The capacitor device according to claim 1, wherein via holes that pass through portions of the insulating film in which the chip capacitor parts is not embedded are further formed, and the upper wiring patterns and the lower wiring patterns include wiring patterns that are connected mutually via the via holes that pass through the insulating film respectively.

5. The capacitor device according to claim 1, wherein at least one wiring layer is connected to the upper wiring patterns and at least one wiring layer is connected to the lower wiring patterns; and wherein the wiring layers are connected to their respective wiring patterns via opening portions in a second insulating film formed on both surface sides of the capacitor device, respectively.

6. The capacitor device according to claim 5, wherein connection terminals are provided to portions of an uppermost wiring layer on the terminals on both end sides of the chip capacitor parts, respectively, and connection terminals are provided to portions of a lowermost wiring layer under the terminals on both end sides of the chip capacitor parts, respectively.

7. The capacitor device according to claim 1, wherein the insulating film is formed of resin.

8. A semiconductor device comprising:

the capacitor device set forth in claim 2;

a circuit board having connection terminals on a lower surface side; and a semiconductor chip mounted on an upper surface side of the circuit board;

wherein the connection terminals of the circuit board on which the semiconductor chip is mounted are connected to upper connection terminals of the capacitor device.

9. A semiconductor device comprising:

the capacitor device set forth in claim 2; and a semiconductor chip connected to upper connection terminals of the capacitor device.

* * * * *